(12) United States Patent
Li et al.

(10) Patent No.: US 11,362,264 B2
(45) Date of Patent: Jun. 14, 2022

(54) ELECTRICAL CONTACT STRUCTURE AND METHODS FOR FORMING THE SAME

(71) Applicant: Vanguard International Semiconductor Corporation, Hsinchu (TW)

(72) Inventors: Chien-Hui Li, Yilan (TW); Chien-Hsun Wu, Hsinchu (TW); Yung-Hsiang Chen, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 288 days.

(21) Appl. No.: 16/837,045

(22) Filed: Apr. 1, 2020

(65) Prior Publication Data

US 2020/0235287 A1 Jul. 23, 2020

Related U.S. Application Data

(62) Division of application No. 15/460,523, filed on Mar. 16, 2017, now Pat. No. 10,651,365.

(51) Int. Cl.
*H01L 21/44* (2006.01)
*H01L 43/02* (2006.01)
(Continued)

(52) U.S. Cl.
CPC .............. *H01L 43/02* (2013.01); *H01L 28/24* (2013.01); *H01L 43/08* (2013.01); *H01L 43/10* (2013.01); *H01L 43/12* (2013.01)

(58) Field of Classification Search
CPC ....... H01L 21/76897; H01L 21/823475; H01L 24/20
See application file for complete search history.

(56) References Cited

U.S. PATENT DOCUMENTS 5,057,453 A 10/1991 Endo et al.
5,674,787 A 10/1997 Zhao et al.
(Continued)

FOREIGN PATENT DOCUMENTS

CN 104051381 A 9/2014
CN 104103505 A 10/2014
(Continued)

OTHER PUBLICATIONS

Chinese Office Action and Search Report for Chinese Application No. 201710013258.9, dated May 23, 2019.

*Primary Examiner* — Bradley Smith
*Assistant Examiner* — David J Goodwin
(74) *Attorney, Agent, or Firm* — Birch, Stewart, Kolasch & Birch, LLP (57) ABSTRACT

An electrical contact structure and a method for forming the electrical contact structure are provided. The method includes forming a thin film material layer on a substrate, forming a first barrier layer on the thin film material layer and forming a metal layer on the first barrier layer. The method further includes patterning the metal layer to form a metal pattern, forming a spacer on a sidewall of the metal pattern and covering a portion of the first barrier layer. The method further includes etching the first barrier layer, wherein the portion of the first barrier layer located under the spacer is not completely etched. The method further includes removing the spacer and exposing the sidewall of the metal pattern to form an electrical contact structure on the thin film material layer, wherein the first barrier layer has a protrusion part exceeding the sidewall of the metal pattern.

11 Claims, 10 Drawing Sheets

(51) Int. Cl.
   *H01L 43/08*    (2006.01)
   *H01L 43/10*    (2006.01)
   *H01L 43/12*    (2006.01)
   *H01L 49/02*    (2006.01)

(56) References Cited

U.S. PATENT DOCUMENTS

| | | |
|---|---|---|
| 6,492,198 B2 | 12/2002 | Hwang |
| 6,596,619 B1 | 7/2003 | Wang et al. |
| 6,605,532 B1 | 8/2003 | Parekh et al. |
| 8,324,738 B2 | 12/2012 | Liu et al. |
| 8,399,989 B2 * | 3/2013 | Lin ............... H01L 24/11 |
| | | 257/E23.129 |
| 8,552,559 B2 * | 10/2013 | Lin ............... H01L 23/5283 |
| | | 257/E21.59 |
| 9,324,669 B2 | 4/2016 | Arvin et al. |
| 9,620,468 B2 * | 4/2017 | Lin ............... H01L 24/13 |
| 10,651,365 B2 * | 5/2020 | Li ............... H01L 43/12 |
| 10,847,712 B2 * | 11/2020 | Wu ............... H01L 43/10 |
| 2004/0253807 A1 | 12/2004 | Thei et al. |
| 2006/0049524 A1 * | 3/2006 | Lin ............... H01L 23/3171 |
| | | 257/E21.582 |
| 2007/0184578 A1 | 8/2007 | Lin et al. |
| 2007/0187727 A1 | 8/2007 | Ting et al. |
| 2010/0171194 A1 | 7/2010 | Lin |
| 2011/0101523 A1 | 5/2011 | Hwang et al. |
| 2012/0043654 A1 | 2/2012 | Lu et al. |
| 2012/0091577 A1 * | 4/2012 | Hwang ............... H01L 24/11 |
| | | 257/E21.477 |
| 2014/0124922 A1 * | 5/2014 | Kim ............... H01L 24/11 |
| | | 257/737 |
| 2015/0004784 A1 | 1/2015 | Yokoyama et al. |
| 2017/0127668 A1 | 5/2017 | Berg et al. |
| 2020/0235286 A1 * | 7/2020 | Marchack ............... H01L 43/02 |

FOREIGN PATENT DOCUMENTS

| | | |
|---|---|---|
| CN | 105355570 A | 2/2016 |
| TW | 508674 B | 11/2002 |

\* cited by examiner

ELECTRICAL CONTACT STRUCTURE AND METHODS FOR FORMING THE SAME

CROSS-REFERENCE TO RELATED APPLICATIONS

This application is a Divisional of copending application Ser. No. 15/460,523, filed on Mar. 16, 2017, which is hereby expressly incorporated by reference into the present application.

BACKGROUND

Field of the Invention

The embodiments of the invention relate to an electrical contact structure and methods for forming the same, and in particular to an electrical contact structure on a thin film material layer and methods for forming the same.

Description of the Related Art

Semiconductor devices have been widely used in various electronic products. For example, personal computers, cell phones, and digital cameras. The manufacture of the semiconductor devices usually includes depositing an insulating layer or a dielectric layer material, a conductive layer material and a semiconductor layer material on a semiconductor substrate in sequence, and using various material layers formed by a lithography process to form circuit parts and components on the semiconductor substrate.

In the semiconductor device, using an element manufactured by a thin film material such as a thin film resistor or a magnetoresistance element can decrease the element size of the semiconductor device. However, at present, there are still a lot of problems with manufacturing electrical contact structures on a thin film material layer, which causes an increase of the resistance of the electrical contact structure and damage to the thin film material layer. Therefore, the manufacturing methods of the electrical contact structure need to be improved further.

BRIEF SUMMARY

According to some embodiments of the invention, a method for forming an electrical contact structure is provided. The method includes forming a thin film material layer on a substrate, forming a first barrier layer on the thin film material layer, forming a metal layer on the first barrier layer and patterning the metal layer to form a metal pattern. The method also includes forming a spacer on a sidewall of the metal pattern and covering a portion of the first barrier layer. The method also includes etching the first barrier layer, wherein the portion of the first barrier layer located under the spacer is not completely etched. The method further includes removing the spacer and exposing the sidewall of the metal pattern to form an electrical contact structure on the thin film material layer, wherein the first barrier layer has a protrusion part exceeding the sidewall of the metal pattern.

According to some embodiments of the invention, an electrical contact structure disposed on a thin film material layer on a substrate is provided. The electrical contact structure includes a first barrier layer disposed on the thin film material layer, and a metal pattern disposed on the first barrier layer, wherein the first barrier layer has a protrusion part exceeding a sidewall of the metal pattern.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is about manufacturing and usage of the embodiments of the invention. However, it should be appreciated that the embodiments of the disclosure provide lots of applicable concepts of the invention and can be performed in multiple forms. The embodiments of the invention discussed herein are demonstrations of manufacturing and using the invention and should not be taken in a limiting sense. In addition, in the description, the performance of a first process and a second process may comprise an embodiment of the second process is immediately performed after the first process, and may also comprises an embodiment of other additional processes performed between the first process and the second process. Many elements may be arbitrarily illustrated in different size ratios. This is for the purpose of simplicity and clarity of the figures. Moreover, when the description addresses a first material layer located on or over a second material layer, it comprises embodiments in which the first material layer and second material layer are formed in direct contact or separated by one or more additional material layers. The following description also addresses some changes of the embodiments. The present invention may use similar reference numerals and/or letters to label similar elements in various figures and embodiments. It should be appreciated that additional steps can be performed before, during or after the method of the embodiments. In other embodiments of the method, some steps can be replaced or omitted.

The method for forming an electrical contact structure according to embodiments of the invention forms a spacer on a sidewall of a metal pattern to overcome problems caused by an under-cut structure formed by over-etching a barrier layer under the metal pattern. Therefore, the electrical stability and reliability of the electrical contact structure are improved, and the resistance of the electrical contact structure is prevented from getting larger.

FIGS. 1A-1I shows cross sections of various stages of a method for forming an electrical contact structure according to some embodiments of the invention.

Figure 1A:
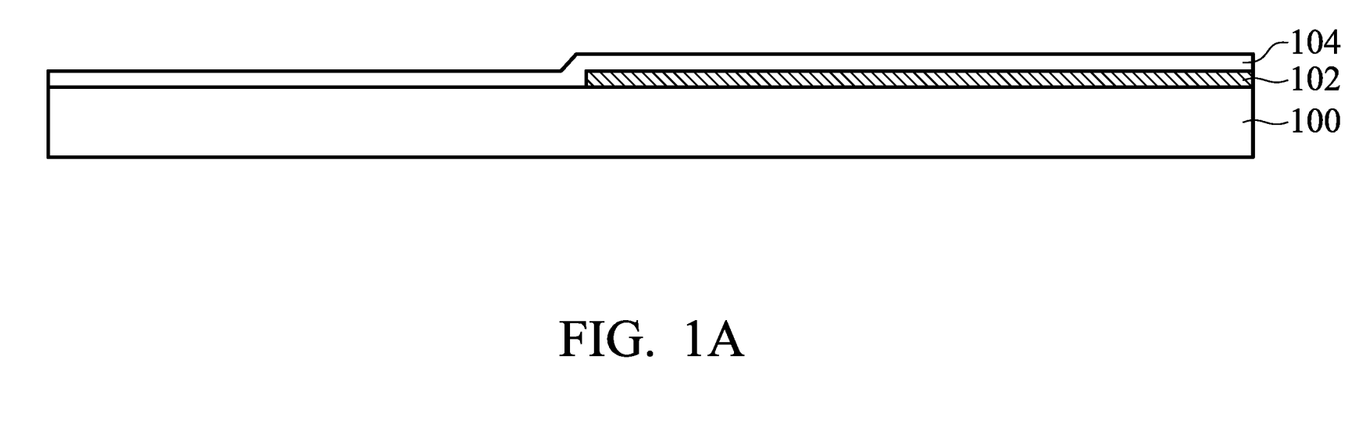
FIGS. 1A-1I shows cross sections of various stages of a method for forming an electrical contact structure according to some embodiments of the invention.

Referring to FIG. 1A, a substrate 100 is provided. In some embodiments, the substrate 100 can be single crystalline silicon substrate, epitaxial silicon substrate, silicon germanium substrate, silicon on insulator (SOI) substrate, compound semiconductor substrate, or another suitable semiconductor substrate. A thin film material layer 102 is formed on the substrate 100. The thickness of the thin film material layer 102 is in a range between about 100 Å and about 200 Å. In some embodiments, the thin film material layer 102 may include a thin film resistance material such as SiCr, NiCr, TaN, or another suitable thin film resistance material. In other embodiments, the thin film material layer 102 may include a thin film material of a magnetoresistance element such as a thin film material of an anisotropic magnetoresistance (AMR) element, a giant magnetoresistance (GMR) element, or another suitable magnetoresistance element. For example, the above thin film material of the magnetoresistance element may be NiFe, CoFe, CoFeB, Cu, PtMn, IrMn, or another suitable thin film magnetoresistance material. In some embodiments, the thin film material layer 102 may be formed by chemical vapor deposition (CVD), physical vapor deposition (PVD), atomic layer deposition (ALD), plasma-enhanced chemical vapor deposition (PECVD), high-density plasma chemical vapor deposition (HDPCVD), metal-organic chemical vapor deposition (MOCVD), pulsed laser deposition (PLD), or another suitable process.

In some embodiments, a first barrier layer 104 is formed on the substrate 100 and the thin film material layer 102. The first barrier layer 104 covers and directly contacts upper surfaces of the substrate 100 and the thin film material layer 102. In some embodiments, the first barrier layer 104 may include TiW, TiN, Ti, or another suitable material. In some embodiments, the TiW used in the first barrier layer 104 has a weight ratio of Ti to W that is 1:9. In some embodiments, the first barrier layer 104 may be formed by chemical vapor deposition (CVD), physical vapor deposition (PVD), atomic layer deposition (ALD), plasma-enhanced chemical vapor deposition (PECVD), high-density plasma chemical vapor deposition (HDPCVD), metal-organic chemical vapor deposition (MOCVD), pulsed laser deposition (PLD), or another suitable process.

Figure 1B:
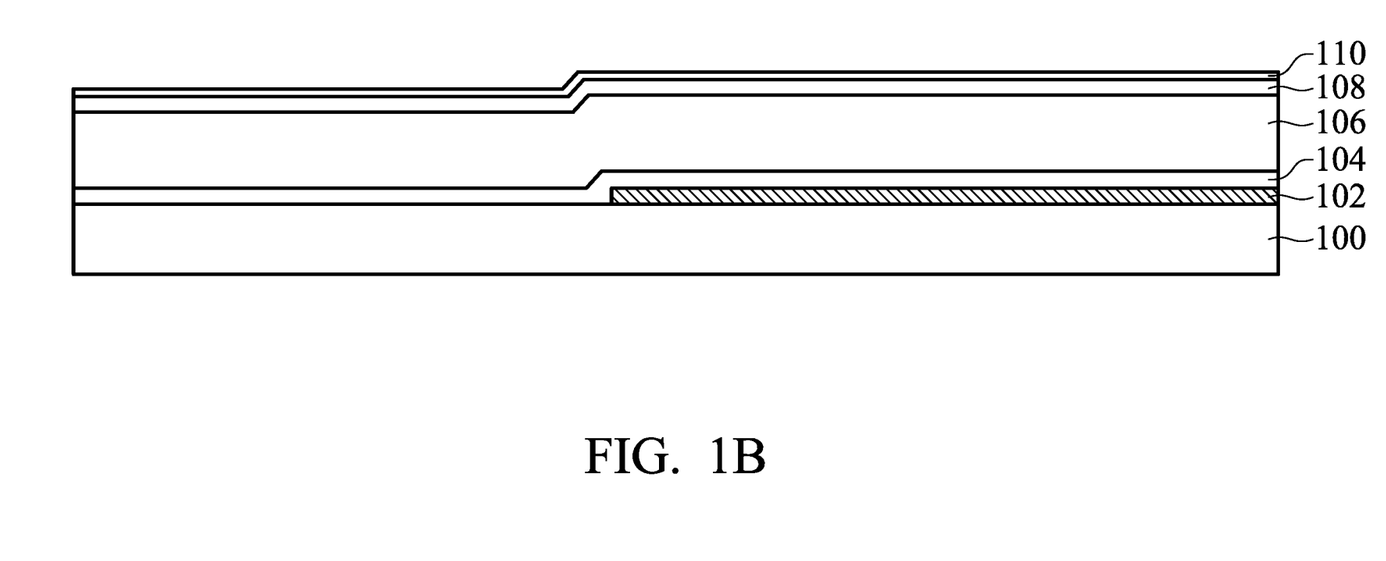

Referring to FIG. 1B, according to some embodiments, then, a metal layer 106 is formed on the first barrier layer 104. In some embodiments, the metal layer 106 comprises a material such as AlCu, AlSiCu, or another suitable material. Then, a second barrier layer 108 is formed on the metal layer 106. In some embodiments, the second barrier layer 108 may include the same material as the material of the first barrier layer 104, such as TiW, Ti or TiN. In some embodiments, the second barrier layer 108 may include a different material from the first barrier layer 104, such as Ta, TaN, or another suitable material.

In some embodiments, then, an anti-reflection layer 110 is formed on the second barrier layer 108. The anti-reflection layer 110 may include a material such as SiON or SiN. In some embodiments, the metal layer 106, the second barrier layer 108 and the anti-reflection layer 110 may be formed by chemical vapor deposition (CVD), physical vapor deposition (PVD), atomic layer deposition (ALD), plasma-enhanced chemical vapor deposition (PECVD), high-density plasma chemical vapor deposition (HDPCVD), metal-organic chemical vapor deposition (MOCVD), pulsed laser deposition (PLD), or another suitable process.

Figure 1C:
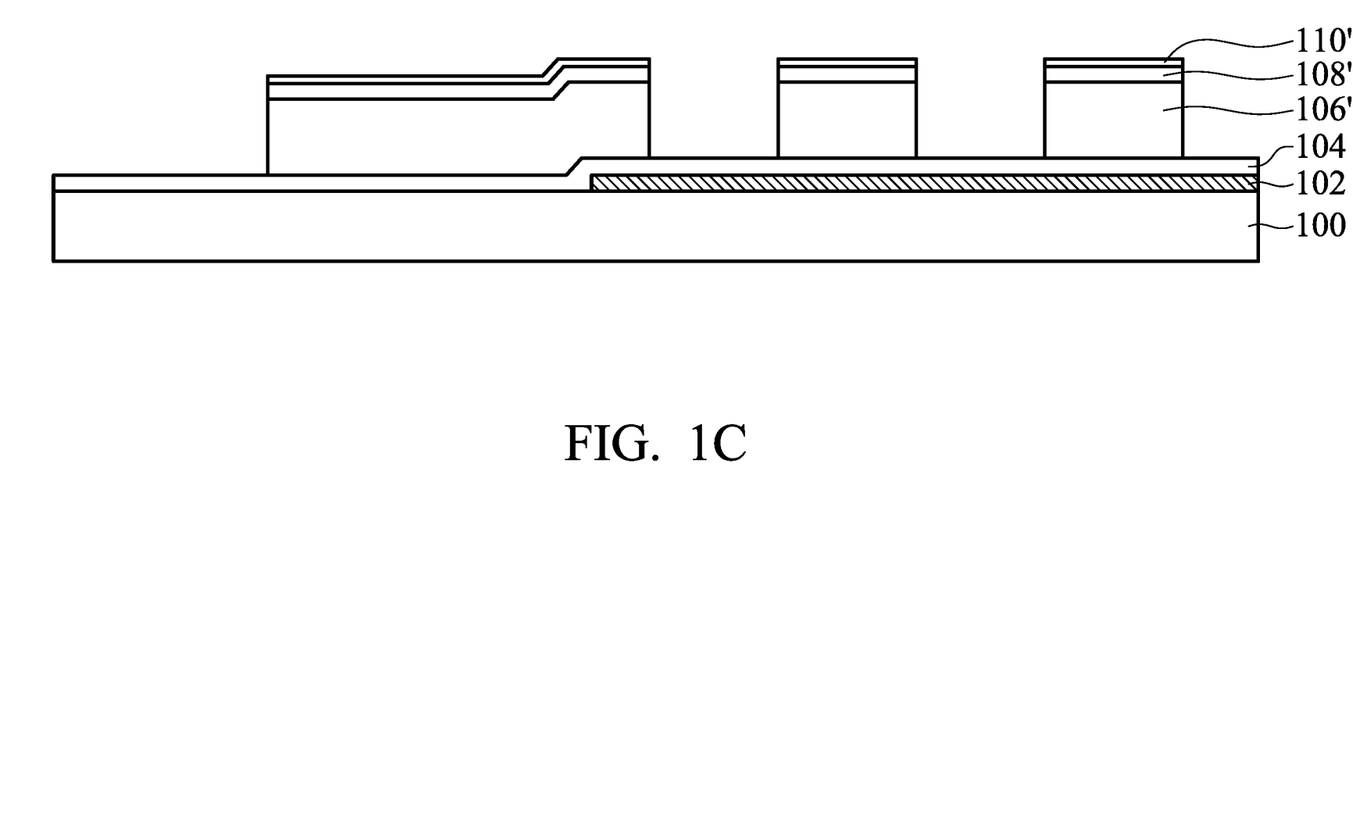

Referring to FIG. 1C, in some embodiments, a patterning process is then performed to pattern the metal layer 106, the second barrier layer 108 and the anti-reflection layer 110 at the same time. In some embodiments, the patterning process comprises forming a mask pattern (not shown) on the anti-reflection layer 110, and using the mask pattern to perform a dry-etching process or another suitable etching process on the metal layer 106, the second barrier layer 108 and the anti-reflection layer 110 to form the metal pattern 106', the patterned second barrier layer 108' and the patterned anti-reflection layer 110' shown in FIG. 1C. Then, the mask pattern on the patterned anti-reflection layer 110' is removed. In some embodiments, the dry-etching process is a reactive-ion etching (RIE) process or a plasma etching process. The dry-etching process stops on the first barrier layer 104, and an upper surface of the first barrier layer 104 and sidewalls of the metal pattern 106', the patterned second barrier layer 108' and the patterned anti-reflection layer 110' are exposed. The dry-etching process is anisotropic etching, and the anisotropic etching only performs etching in a vertical direction and does not perform etching in a horizontal direction. Therefore, the metal pattern 106', the patterned second barrier layer 108' and the patterned anti-reflection layer 110' have patterns that completely overlap one another, as shown in FIG. 1C.

Figure 1D:
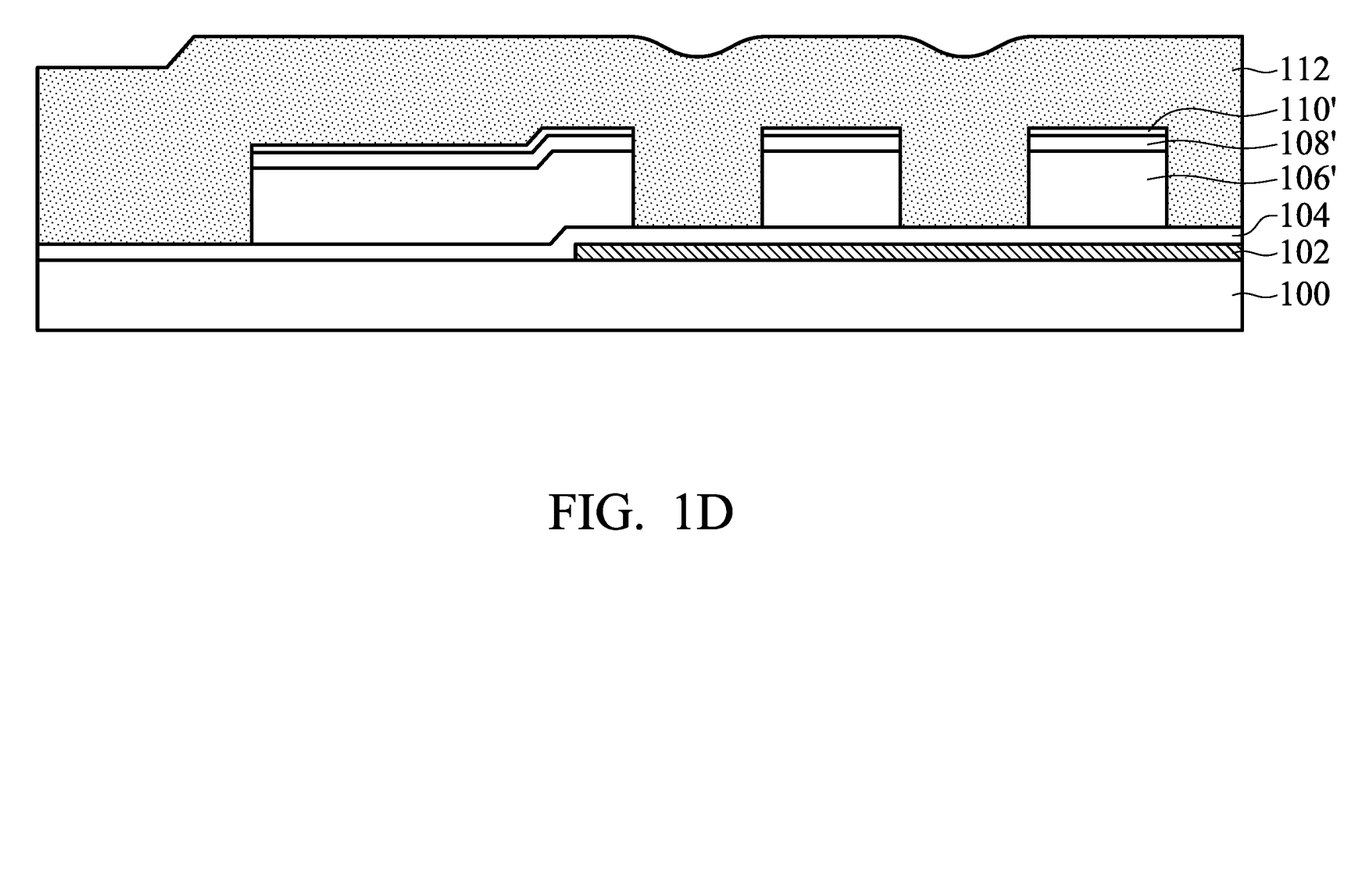

Referring to FIG. 1D, a photoresist layer 112 is formed on the first barrier layer 104, the metal pattern 106', the patterned second barrier layer 108' and the patterned anti-reflection layer 110', and the photoresist layer 112 fills a space formed between the metal patterns 106', patterned second barrier layers 108' and patterned anti-reflection layers 110'. The photoresist layer 112 may be formed by, for example, a spin coating process, a spray coating process, another suitable process, or a combination thereof.

Figure 1E:
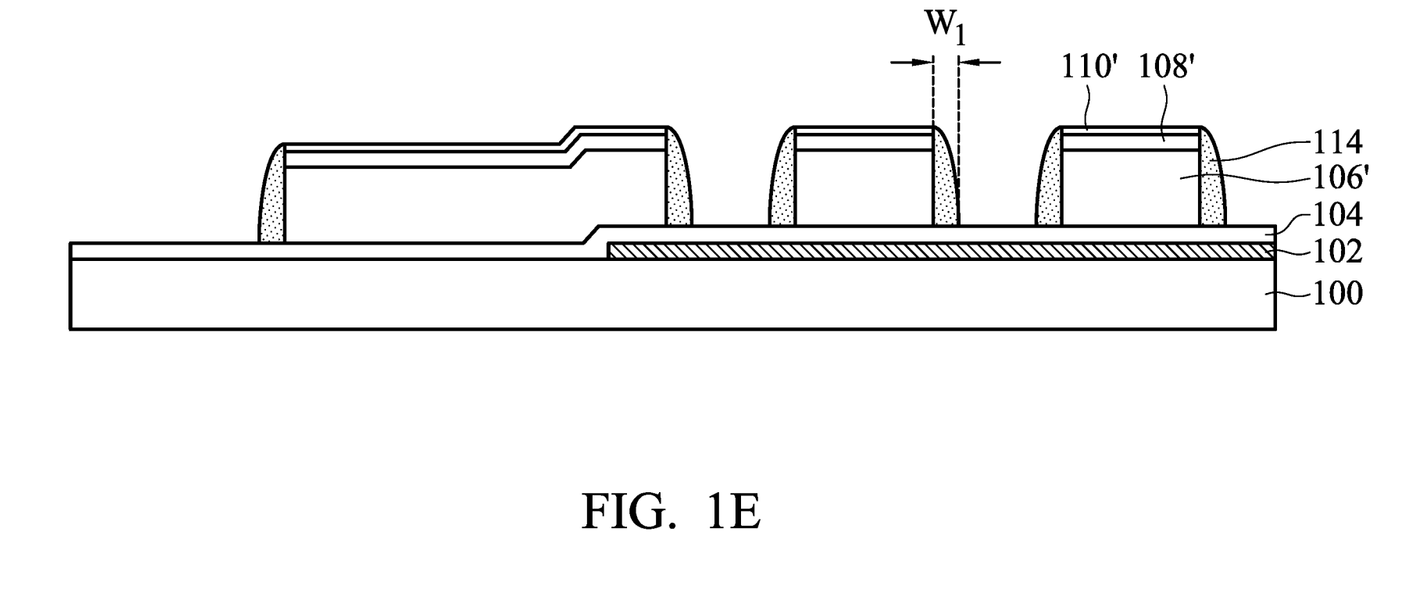

Referring to FIG. 1E, in some embodiments, a photoresist etch back process is performed to etch the photoresist layer 112, and a spacer 114 is formed on the sidewalls of the metal pattern 106', the patterned second barrier layer 108' and the patterned anti-reflection layer 110'. The spacer 114 also contacts the upper surface of the first barrier layer 104 and covers a portion of the first barrier layer 104. In some embodiments, the photoresist etch back process is a dry-etching process such as a reactive-ion etching (RIE) process or a plasma etching process. In some embodiments, the width $W_1$ of the bottom of the spacer 114 is in a range between about 0.1 μm and about 0.3 μm.

Figure 1F:
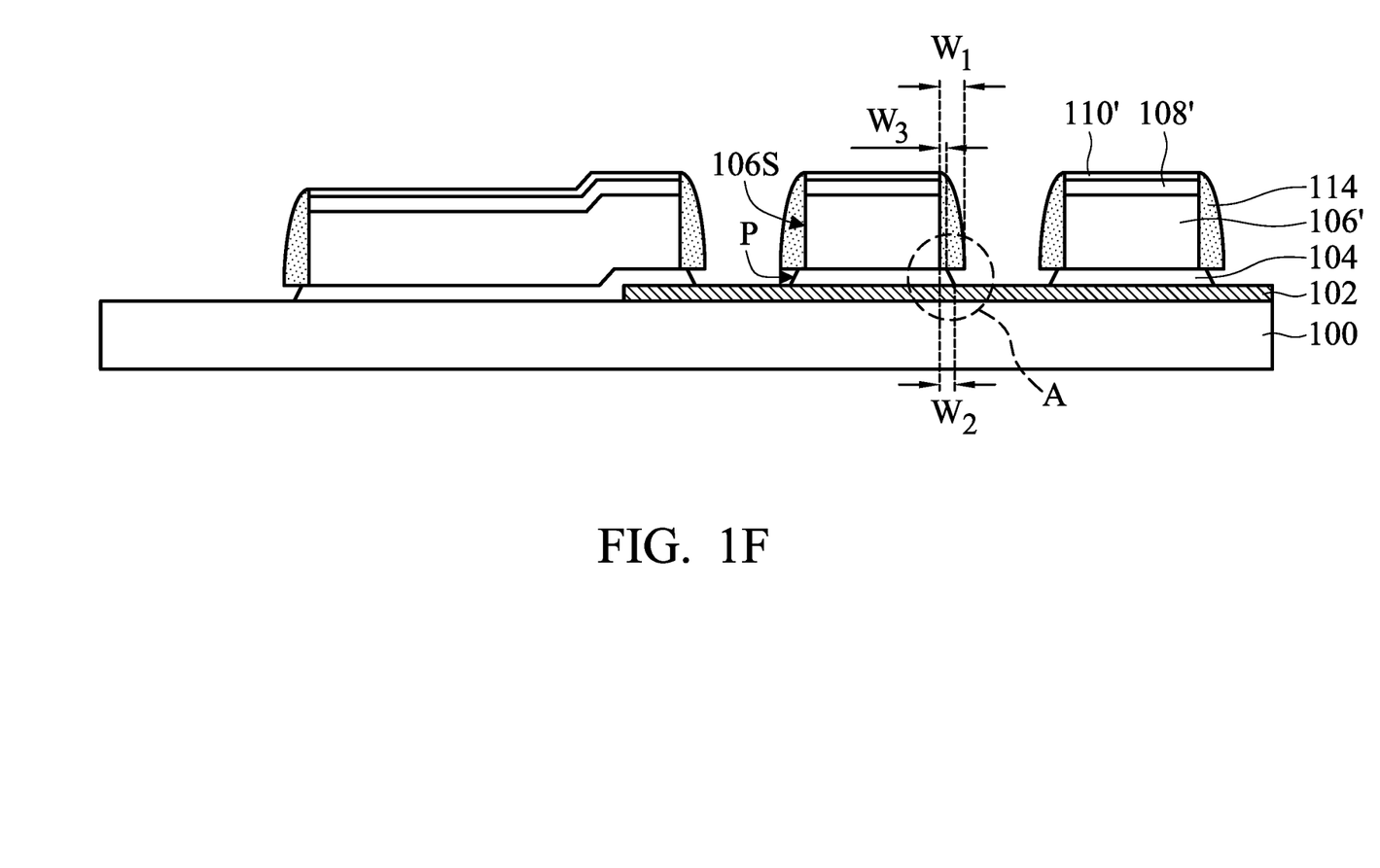

Referring to FIG. 1E, in some embodiments, a wet-etching process is performed to etch the first barrier layer 104. The wet-etching process is isotropic etching, and the wet-etching process has a very high etching selectivity ratio to the thin film material layer 102. When the first barrier layer 104 is etched by the wet-etching process, a portion of the first barrier layer 104 covered by the spacer 114 is not completely etched. Therefore, the first barrier layer 104 has a protrusion part P exceeding the sidewall 106S of the metal pattern 106' after the wet-etching process is finished. In some embodiments, for example, an etchant used in the wet-etching process is an $H_2O_2$-based etchant. For example, the material of the above-mentioned first barrier layer 104 may be TiW, TiN or Ti. The above-mentioned thin film material layer 102 may include a thin film resistance material such as SiCr, NiCr, TaN, or another suitable thin film resistance material. In other embodiments, the thin film material layer 102 may include a thin film material of a magnetoresistance element such as a thin film material of an anisotropic magnetoresistance (AMR) element, a giant magnetoresistance (GMR) element, or another suitable magnetoresistance element. For example, the above thin film material of the magnetoresistance element may be NiFe, CoFe, CoFeB, Cu, PtMn, IrMn, or another suitable thin film magnetoresistance material.

Figure 2:
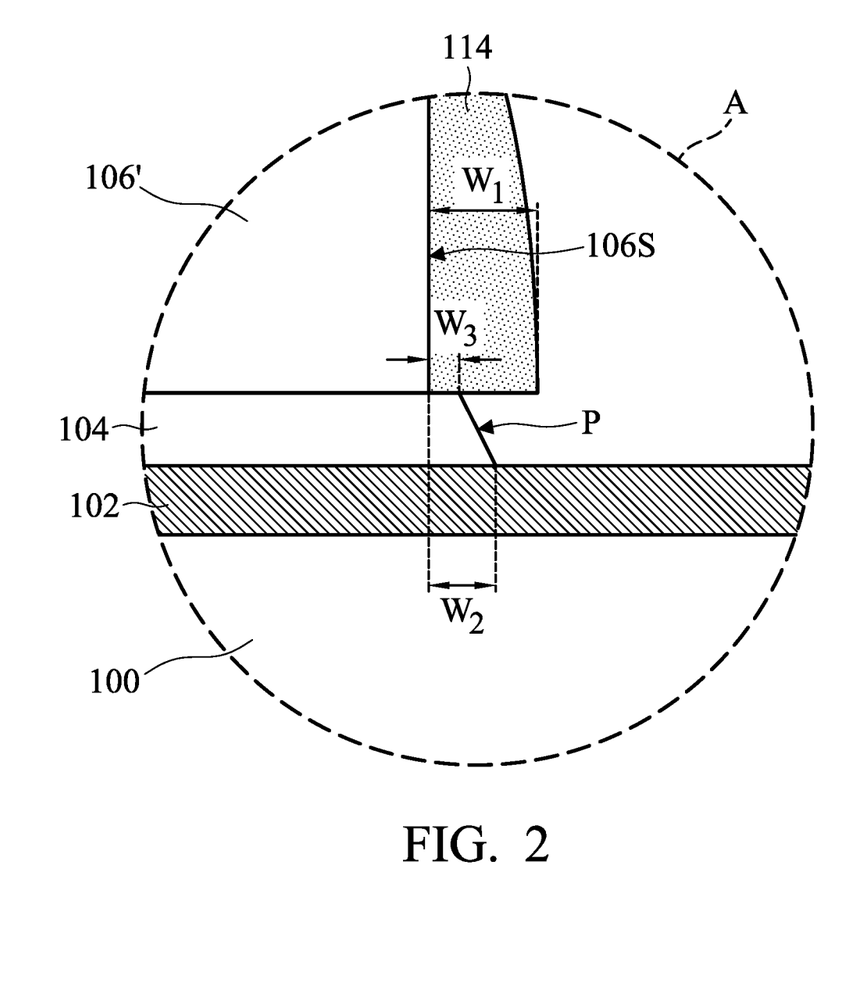
FIG. 2 shows an enlarged view of a region A of FIG. 1F.

FIG. 2 shows an enlarged view of a region A of FIG. 1F according to some embodiments of the invention. The protrusion part P protrudes outwardly from the sidewall of the metal pattern 106'. The bottom of the protrusion part P has a width $W_2$, and the top of the protrusion part P has a width $W_3$. In some embodiments, the width $W_3$ is in a range between about 0 μm (such as 0.01 μm) and about 0.2 μm, and the width $W_2$ is in a range between about 0 μm (such as 0.01 μm) and about 0.2 μm. In some embodiments, the width $W_3$ may be greater than the width $W_2$. In some embodiments, the width $W_2$ may be greater than the width $W_3$. In some embodiments, the width $W_3$ may be equal to the width $W_2$.

In embodiments of the invention, since the spacer 114 covers the sidewall 106S of the metal pattern 106', the spacer 114 can protect the metal pattern 106', the patterned second barrier layer 108' and the patterned anti-reflection layer 110' during the process of etching the first barrier layer 104, and the first barrier layer 104 would not be over-etched to be shrunk within the sidewall 106S of the metal pattern 106' to form an under-cut structure. Accordingly, the electrical contact structure of the embodiments of the invention has the advantages of improving electrical stability and reliability and preventing the resistance of the electrical contact structure from getting larger.

Figure 1G:
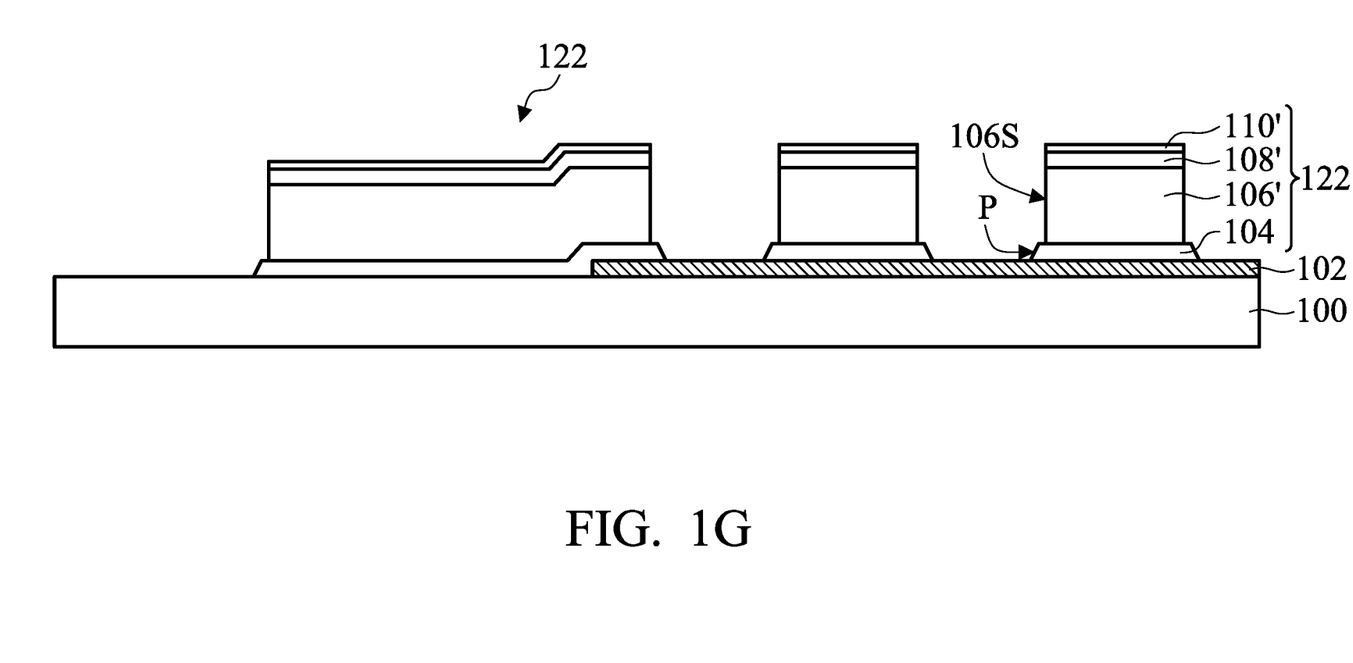

Referring to FIG. 1G, the spacer 114 is then removed to form an electrical contact structure 122 on the thin film material layer 102. The electrical contact structure 122 comprises the first barrier layer 104, the metal pattern 106', the patterned second barrier layer 108' and the patterned anti-reflection layer 110'. In some embodiments, after the spacer 114 is removed, the protrusion part P of the first barrier layer 104 protruding outwardly from the sidewall 106S of the metal pattern 106' is exposed. The protrusion part P exceeds the sidewall 106S of the metal pattern 106'.

Figure 1H:
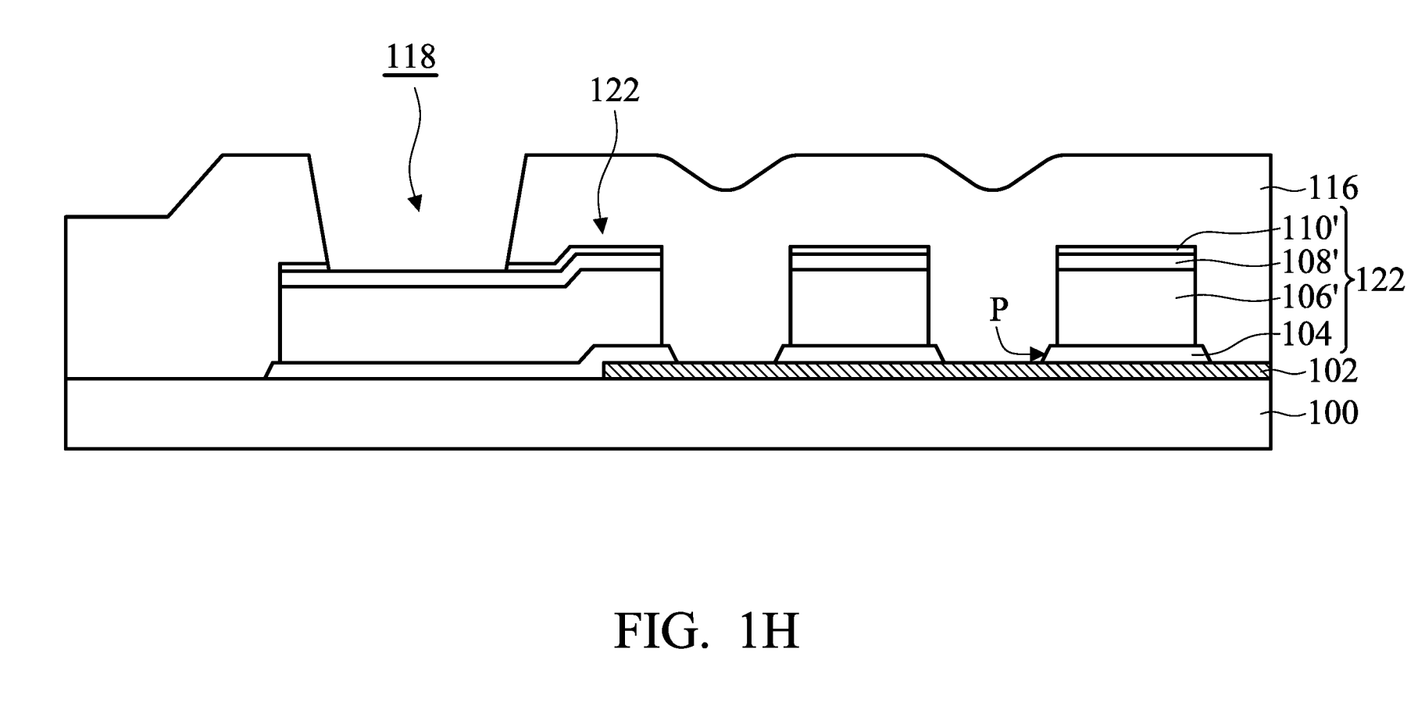

Referring to FIG. 1H, in some embodiments, a protection layer 116 is formed on the substrate 100 and covers the thin film material layer 102 and the electrical contact structure 122. The protection layer 116 contacts the upper surface of the thin film material layer 102, the protrusion part P of the first barrier layer 104 and the sidewalls of the metal pattern 106', the patterned second barrier layer 108' and the patterned anti-reflection layer 110'. In some embodiments, the protection layer 116 has an opening 118 located directly on a portion of the metal pattern 106' of the electrical contact structure 122. A portion of the patterned anti-reflection layer 110' exposed by the opening 118 is removed to expose a portion of an upper surface of the patterned second barrier layer 108'. In some embodiments, the opening 118 of the protection layer 116 is used as a conductive feature such as a conductive bump electrically connected to external circuits. In some embodiments, the protection layer 116 may include a material such as silicon nitride, silicon oxide, or another suitable material deposited at a low temperature or a high temperature, such as SiN or $SiO_2$ deposited in 250° C. or 400° C. The protection layer 116 may be formed by chemical vapor deposition (CVD), physical vapor deposition (PVD), atomic layer deposition (ALD), plasma-enhanced chemical vapor deposition (PECVD), high-density plasma chemical vapor deposition (HDPCVD), metal-organic chemical vapor deposition (MOCVD), pulsed laser deposition (PLD), or another suitable process.

Figure 1I:
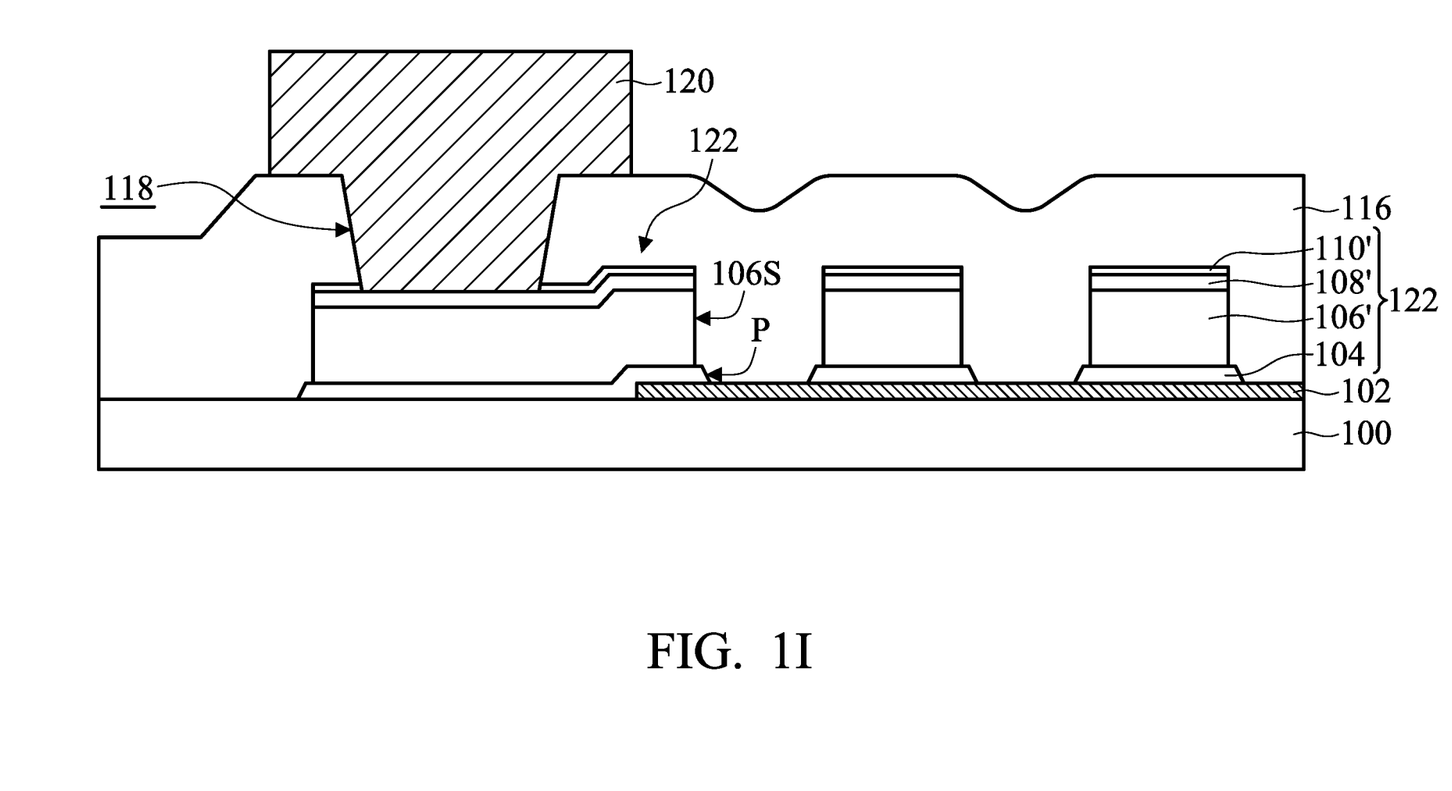

Referring to FIG. 1I, in some embodiments, a conductive feature 120 is formed in the opening 118 and is formed on a portion of the protection layer 116 to electrically connect the electrical contact structure 122 to external circuits. The conductive feature 120 may be formed by chemical vapor deposition (CVD), physical vapor deposition (PVD), atomic layer deposition (ALD), plasma-enhanced chemical vapor deposition (PECVD), high-density plasma chemical vapor deposition (HDPCVD), metal-organic chemical vapor deposition (MOCVD), pulsed laser deposition (PLD), or another suitable deposition process and a patterning process.

According to some embodiments of the invention, an electrical contact structure and methods for forming the electrical contact structure are provided. In the method for forming the electrical contact structure, while etching the barrier layer under the metal pattern, a spacer is formed on the sidewall of the electrical contact structure to provide protection. The spacer can prevent the sidewall of the electrical contact structure from lateral etching during the etching process of the barrier layer, and can also prevent the metal pattern and the barrier layer under the metal pattern from forming an under-cut structure. Therefore, the electrical stability and reliability of the electrical contact structure are improved, and the resistance of the electrical contact structure is prevented from getting larger. In addition, additional photomasks are not needed to form the spacer. Accordingly, it does not increase manufacturing costs.

While the disclosure has been described by way of example and in terms of the embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming an electrical contact structure, comprising:
   forming a thin film material layer on a substrate;
   forming a first barrier layer on the substrate and covering a sidewall and a top surface of the thin film material layer, wherein the sidewall of the thin film material layer is at an end of the thin film material layer;
   forming a metal layer on the first barrier layer;
   patterning the metal layer to form a metal pattern;
   forming a spacer on a sidewall of the metal pattern and covering a portion of the first barrier layer;
   etching the first barrier layer, wherein the portion of the first barrier layer located under the spacer is not completely etched; and
   removing the spacer and exposing the sidewall of the metal pattern to form an electrical contact structure on the thin film material layer, wherein the first barrier layer has a protrusion part exceeding the sidewall of the metal pattern.

2. The method of claim 1, wherein forming the spacer comprises:
   forming a photoresist layer covering the metal pattern and the first barrier layer; and
   performing a photoresist etch back process to form the spacer.

3. The method of claim 1, wherein the thin film material layer comprises a thin film resistance material or a thin film material of a magnetoresistance element, and the thin film resistance material comprises SiCr, NiCr or TaN, the magnetoresistance element comprises an anisotropic magnetoresistance element or a giant magnetoresistance element, and the thin film material of the magnetoresistance element comprises NiFe, CoFe, CoFeB, Cu, PtMn or IrMn.

4. The method of claim 1, wherein the metal layer comprises AlCu or AlSiCu.

5. The method of claim 1, wherein the first barrier layer comprises TiW, Ti or TiN.

6. The method of claim 1, wherein etching the first barrier layer comprises a wet-etching process, and an etchant used in the wet-etching process includes $H_2O_2$.

7. The method of claim 1, further comprising forming a protection layer on the thin film material layer and the electrical contact structure, and the protection layer has an opening located directly on the metal pattern.

8. The method of claim 1, further comprising:
   forming a second barrier layer on the metal layer; and
   forming an anti-reflection layer on the second barrier layer, wherein the second barrier layer and the anti-reflection layer are patterned at the same time in the step of patterning the metal layer to form a pattern that completely overlaps the metal pattern.

9. The method of claim 8, wherein the second barrier layer comprises TiW, Ti, TiN, Ta or TaN, and the anti-reflection layer comprises SiON or SiN.

10. The method of claim 8, further comprising etching the anti-reflection layer to expose an upper surface of the second barrier layer.

11. The method of claim 1, wherein patterning the metal layer comprises a dry-etching process, and the dry-etching process stops on the first barrier layer.

* * * * *